United States Patent [19]

AuYeung

[11] Patent Number: 4,504,950
[45] Date of Patent: Mar. 12, 1985

[54] TUNABLE GRADED ROD LASER ASSEMBLY

[75] Inventor: John C. AuYeung, Alhambra, Calif.

[73] Assignee: California Institute of Technology, Pasadena, Calif.

[21] Appl. No.: 353,903

[22] Filed: Mar. 2, 1982

[51] Int. Cl.³ .............................................. H01S 3/10
[52] U.S. Cl. ........................................ 372/20; 372/97;
372/101; 372/18; 372/11; 350/96.18; 350/413
[58] Field of Search ............... 372/6, 101, 20, 97;
350/96.18, 413

[56] References Cited

U.S. PATENT DOCUMENTS

| 3,829,195 | 8/1974 | Rawson | 350/96.18 |
| 4,199,222 | 4/1980 | Ikushima et al. | 350/96.18 |
| 4,269,648 | 5/1981 | Dakss et al. | 350/96.18 |
| 4,281,891 | 8/1981 | Shinohara et al. | 350/96.18 |

OTHER PUBLICATIONS

Saruwatari et al.; "Efficient Laser Diode to Single-Mode Fiber Coupling Using a Combination of Two Lenses in Confocal Condition", IEEE Jou. Quant. Elect., vol. QE-17, No. 6, Jun. 1981.

Akiba et al.; "High Rate Pulse Generation from In-GaAsP Laser in Selfoc Lens External Resonator", Elect. Lett., vol. 17, No. 15, Jul. 1981.

Primary Examiner—William L. Sikes
Assistant Examiner—Léon Scott, Jr.
Attorney, Agent, or Firm—Jackson, Jones & Price

[57] ABSTRACT

A tunable laser assembly including a pair of radially graded indexed optical segments aligned to focus the laser to form an external resonant cavity with an optical axis, the respective optical segments are retativity moveable along the optical axis and provide a variable et aion gap sufficient to permit variable tuning of the laser wavelength without altering the effective length of the resonant cavity. The gap also include a saturable absorbing material providing a passive mode-locking of the laser.

14 Claims, 2 Drawing Figures

TUNABLE GRADED ROD LASER ASSEMBLY

BACKGROUND OF THE INVENTION

1. Origin of the Invention

The invention described herein was made in the performance of work under a NASA Contract and is subject to the provisions of Section 305 of the National Aeronautics and Space Act of 1958, Public Law 85-568 (72 STAT 435; 43 USC 2457).

2. Field of the Invention

The present invention is directed to an improved tunable laser assembly and more particularly, to a gap tunable graded index rod lens that has the capability of providing a passive mode locking of the laser assembly.

3. Description of the Prior Art

With increased emphasis upon the use of lasers, particularly in the communication and data field, there exists a desire to provide a relatively easily assembled and accurately aligned laser assembly that is capable of producing ultra short pulses at a high repetition rate. It is particularly highly desirable to provide pulse lengths of under 20 pico seconds.

Modelocking is the most common way to produce ultra short pulses at high repetition rates. In order to modelock a semiconductor diode laser, an external resonant cavity is required because the diode's own cavity is too short to allow discrete mode locking. Previously suggested modelocked diode lasers have incorporated an external resonant cavity which included either a spherical mirror or a combination of a microscope lens and a plane mirror. Problems have occurred with the use of a microscope objective lens in both alignment and the fact that it is too large to allow an extremely high modulation frequency (modelocking repetition rate is inversely proportional to the resonator length). While the spherical mirror can be made short enough, it is still extremely difficult to align.

An example of a diode laser arrangement to provide a bandwidth limited ultrashort pulse generation laser system is disclosed in the IEEE Journal of Quantum Electronics, Vol. QE-17, No. 5, Page 658, May 1981, "Bandwidth-Limited Picosecond Pulses from an Actively Mode Locked GaAlAs Diode Laser" by Bradley et al. Another example is disclosed in Electronics Letters, Vol. 17, No. 15, Page 527, July 23, 1981, "High Rate Pulse Generation from InGaAsP Laser in Selfoc Lens External Resonator" by Akiba et al.

The ability to utilize a graded index optical rod as a portion of an external resonator cavity with a semi-conductor laser is suggested in U.S. Pat. No. 3,838,358. This patent further discloses the desirability of using appropriate anti-reflection coatings and high reflective coatings in the formation of the cavity structure. Finally, U.S. Pat. No. 3,439,289 and U.S. Pat. No. 3,894,789 are cited of general interest.

The prior art is still seeking an optimum laser assembly that can be economically manufactured while producing ultra short pulses at a high repetition rate.

OBJECT AND SUMMARY OF THE INVENTION

It is a primary object of the present invention to provide a gap tunable graded index rod lens assembly for lasers that can be economically manufactured to provide ultra short optical pulse generation.

It is another object of the present invention to provide passive modelocking with a graded index rod lens resonator.

It is a further object of the invention to eliminate the problems of precision optical alignment of conventional external resonating cavities for laser systems while providing a relatively easy manufactured and compact laser assembly.

It is yet a further object of the present invention to provide a laser assembly that is gap tunable with passive modelocking provided between a pair of graded index rod lens forming an external resonator cavity of a laser system.

Briefly described, the present invention involves an effort to address the needs of a relatively easily manufactured and inexpensive laser assembly that is capable of a high rate modulation to produce repetitive pulse generation from a laser. Such an inexpensive laser assembly would be of particular importance in such applications as high bit rate optical communication and very fast data processing.

More particularly, the subject invention includes an active laser medium such as a semi-conductor diode laser that has an external resonant cavity formed by a pair of radially graded index optical segments. The optical segments are aligned with and capable of focusing the laser. The optical segments are relatively movable, for example, by a piezoelectrically-driven translator to provide a variable etalon gap of dimensions sufficient to permit a variable tuning of the laser wavelength without altering the effective length of the resonant cavity. The gap can further include a saturable absorbing material such as a dye to permit a passive modelocking of the laser. A resilient seal can permit the relative movement of the optical segments or rods to varying the gap for tuning purposes while accommodating any volumetric changes of the dye solution.

The etalon gap is coated with a partially reflecting material and the parallel surfaces of the gap are positioned at a slight angle to a normal plane to the optical axis.

The optical segment adjacent the laser medium is coated with an anti-reflective coating while the surface furthest from the laser medium can be coated with a highly reflective coating such as gold. Likewise, the active laser medium can have an anti-reflective coating on its end surface adjacent the optical segment and reflective coating on its outer surface.

The laser also can be actively modelocked by RF power that is modulated at a frequency in resonance with the laser cavity.

Further objects and the many attended advantages of the invention may be best understood by reference to the following detailed description taking into conjunction with the accompanying drawing.

DESCRIPTION OF THE PREFERRED EMBODIMENT

The following description is provided to enable any person skilled in the laser art to make and use the present invention and sets forth the best mode contemplated by the inventor in carrying out his invention. Various modifications to the disclosed embodiment, however, will be readily apparent to those skilled in the art, since the generic principles of the present invention have been defined herein specifically to provide a relatively economical and easily manufactured laser system capable of generating ultrashort optical pulses.

Figure 1:
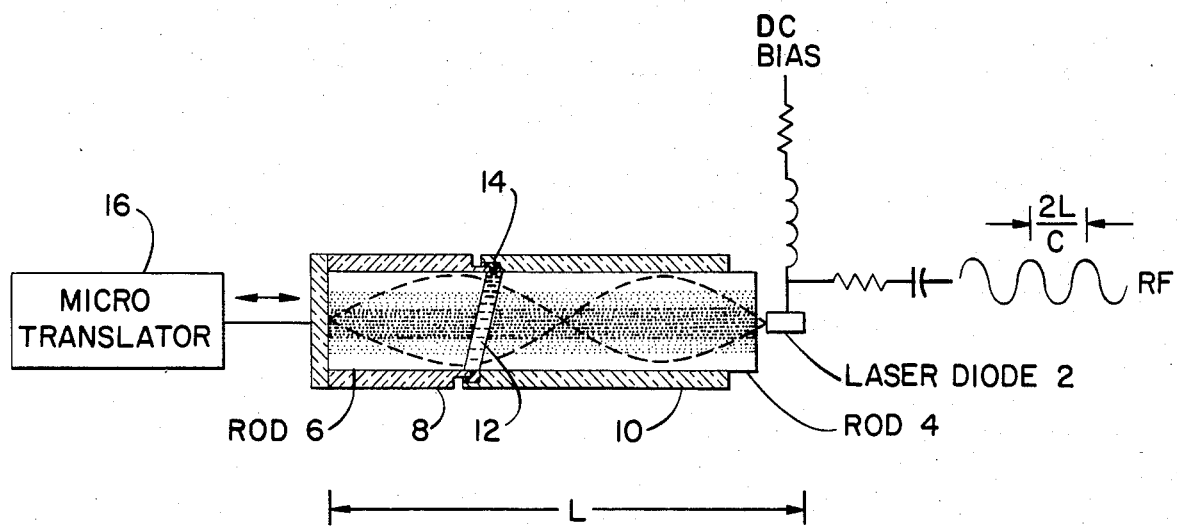
FIG. 1 is a schematic illustration of one embodiment of the present invention.

Referring to FIG. 1, the schematic embodiment of the present invention is disclosed in a relatively simple, easily assembled, compact laser system that has been specifically designed to lower manufacturing costs. It is further believed that this preferred embodiment will be rugged and will provide a simple resonator cavity which can be quickly and easily positioned without requiring the high precision alignment of the more conventional mirror resonant cavities.

The active laser medium 2 can be a conventional semiconductor laser diode, for example, a CW laser diode sold by the General Optronics Corporation of South Plainfield, N.J., as their GOLS series or an HLP-1400 laser diode sold by Hitachi of Japan. Generally, these laser diodes are mounted on a specially designed heat sink and are particularly suited to applications such as analog and digital CATV fiber optic transmission, fiber telephone transmission systems, high speed computer data links, non-impact printers, alignment monitoring systems, electronic distance measuring systems and optical scanning systems.

Aligned with and capable of focusing the laser diode 2 is a pair of optical segments or rods 4 and 6. These rods are copmmercially available as graded index optical segments and are sold under the name Selfoc Micro Lens by Nippon Sheet Glass Company, Selfoc Division, Osaka, Japan. Basically, these rods can be glass or clear plastic that are fabricated by coating a core having the highest index of refraction with layers of material having successively lower indices of refraction. The light from the core of the optical rod, when it passes outward to the lower index layers, is reflected internally and will travel along the rod as a waveguide. The grading of the index of refraction is gradual and refracts light to provide the functional equivalence of a light bending conventional lens. Thus, the graded index optical rods 4 and 6 become a lens system for focusing the laser light from the emitting surface of the semiconducter laser 2 onto the reflective surface at one end of rod 6. For a laser wavelength of approximately 830 nanometers, a pair of Selfoc rods having a code specification SLW, a diameter of 2.0 millimeters and a pitch length of 21.9 millimeters, can be used. As shown in FIG. 1 a full pitch length is provided so that an erect real image could be formed on the end of rod 6.

The laser diode 2 should be carefully positioned at the center of the rod 4. In the particular embodiment illustrated the index of refraction on the optical axis will be 1.607.

The surface of the laser diode 2 adjacent the rod 4 is preferably coated with an anti-reflective coating of a conventional design. Since anti-reflective coatings are well known in the optical field and in the field of lasers, a discussion of the particular coating parameters is not necessary for a full understanding of the present invention. The end surface of the optical rod 4 is likewise coated with an anti-reflective coating. The end surface of rod 6 furthest from the laser diode 2 is coated with a highly reflective coating such as gold. As can be appreciated, the total laser cavity length is represented by the symbol L and the respective optical rods 4 and 6 form the external resonant cavity to the laser diode 2 and are mounted along the optical axis of the cavity.

A pair of annular sleeves 8 and 10 can mount the respective optical rods 8 and 10. Preferably the internal surface of the respective sleeves are coated with an optical black to eliminate undesirable reflections. Sleeve 10 can be permanently mounted relative to the laser diode 2 while sleeve 8 is relatively moveable.

A gap or variable space 12 is formed between the optical rods 4 and 6. The adjacent or internal surfaces of the respective rods to the gap 12 are parallel and are positioned at a slight angle to a normal plane to the optical axis of the laser diode 2. The resulting gap forms an etalon. The etalon is positioned within the external resonant cavity and the adjacent end surfaces of the optical rods 4 and 6 are coated with a reflective material to provide a percentage of reflection between 50 percent to 90 percent. The resulting Q of this external resonant cavity will be high only for those wavelengths of integral submultiples of twice the gap width. That is, the laser will oscillate only at those selected wavelengths. By varying the thickness of the etalon gap 12, the lasing wavelengths can be appropriately tuned. Since the intracavity etalon on gap 12 only allows a small portion of the frequency spectrum to oscillate, it serves effectively as a band limiting device to reduce noise. Thus, incident wavelengths that are not integral submultiples of twice the gap width will be reflected away from the optical axis of the external resonant cavity and consequently, removed from the resonant cavity. For schematic purposes only, a ray trace has been shown in FIG. 1 extending through the length of the rods 4 and 6. This ray trace is not representative of the specific actual optical path, but is only illustrative to disclose the refraction bending characteristics of the radially graded index optical rods 4 and 6 and the focusing capability of these rods on the emitting surface of the laser diode 2 and the 100 percent reflecting surface of the optical rod 6.

Each of the optical rods 6 and 8 present an index profile as follows:

$$N = N_o \left(1 - \frac{2r^2}{b^2}\right)$$

(wherein N is the refractive index at a distance from the optical axis of r in millimeters; $N_o$ is the refractive index on the optical axis; r is the distance from the optical axis in millimeters and b is a positive constant in millimeters disclosing the rate of change of the index for the particular rod segment.

The total length of the rod segments is chosen to be an integral multiple of $\pi b/4$, which corresponds to either a collimation of the laser light if the length is an odd multiple of $\pi b/4$ or imaging of the laser light if it is an even multiple onto the reflecting end surface of the respective rod 6 and anti-reflecting end surface of laser diode 2. The etalon gap 12 is approximately 50 microns in width and is preferably variable over a distance of several wavelengths (that is, over several microns).

The sleeve 8 can be moved by a piezoelectrically driven microtranslator 16, for example, of the type provided with a micrometer and sold by Tropel of 52 West Avenue, Fairport, N.Y. In essence, the application of an electric field to the piezoelectric element will produce a movement in the range of microns and by varying the voltage the desired movement can be achieved for tuning the etalon gap 12.

As can be readily appreciated, the etalon gap 12 can be simply an air cavity.

The laser diode 2 is actively modelocked by driving it with a radio frequency equivalent to twice the length of the resonant cavity divided by the speed of light (C/2L). It is highly desirable to provide a passive modelocking feature which produces shorter pulses than those by active modelocking. This can be accomplished in the present invention by filling the etalon gap 12 with a saturable absorbing material such as a fluid dye solution to provide a passive modelocking scheme. The replacement of the air with an absorbing material such as dye will not affect the wavelength selection and bandwith limiting functions of the etalon. The effective length of the resonant cavity 2 is designed to take into account any influence of the index of refraction of the dye material. A dye such as DEOTC-P(4) having a dye center frequency of 7956 nanometers, a lasing range of 765 to 875 nanometers with a concentration of approximately $0.6 \times 10^{-3}$ moles per liter can be utilized. Such a dye is commercially available from Spectra-Physics. Thus, the etalon gap 12 can have a dual function of being the receptacle for a saturable absorbing dye to provide a passive modelocking arrangement. An annular resilient sealing member 14 can seal the etalon gap 12 and can provide sufficient resiliency to permit any minute adjustment of the etalon gap fluidic volume 12 during the tuning by the microtranslator 16. It is only important that the dye totally fill the gap regardless of the tuning distance and by providing a resilient annular seal 14 that can even have a reservoir capacity if desired, this qualification can be met.

In summary, a tunable laser assembly is provided with an external resonant cavity formed by a pair of radially graded indexed optical segments 4 and 6 having positioned there between a variable etalon gap 12 of a dimension sufficient to permit a variable tuning of the laser wavelength without altering effective length of the resonant cavity. Additionally, a saturable absorbing material such as a dye can be positioned in the gap to permit a passive modelocking of the laser without any interference of an active modelocking. Use of the microtranslator 16 permits the width of the etalon gap 12 to be varied to provide a tunable etalon with a high Q for certain wavelengths.

Figure 2:
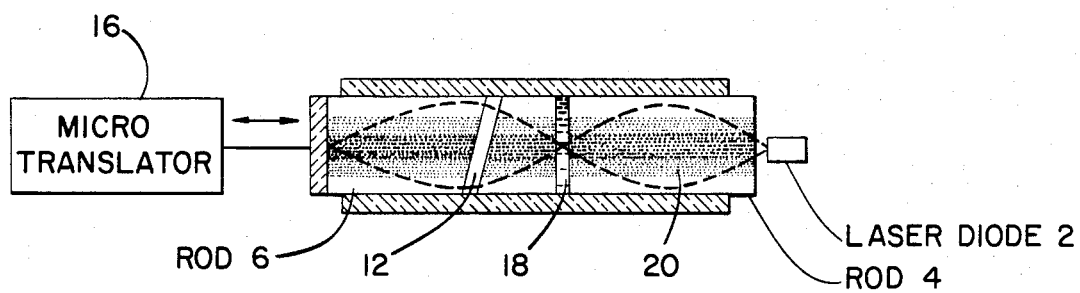
FIG. 2 is a schematic illustration of a second embodiment.

Alternatively, a third optical rod 20 can be provided as shown in FIG. 2 and can be spaced from one of the other optical rods to provide a second gap 18 having parallel surfaces normal to the optical axis. The second gap can be filled with the saturable absorbing material such as the dye for providing the passive modelocking of the laser. Thus, the tunable etalon gap 12 would be supplemented with a second gap dedicated only to supporting the dye medium for providing passive modelocking. This can remove any sealing problems since this gap would not need to be variable. The parallel walls of the gap that are perpendicular to the optical axis could be coated with an anti-reflective coating. The microtranslator 16 can then drive the rod 6 into and out of a stationary unitary sleeve for focusing purposes.

While a preferred embodiment of the present invention has been described hereinabove, it is intended that all matter contained in the above description and shown in the accompanying drawing be interpreted as illustrative and not in a limiting sense and all modifications, constructions and arrangements which fall within the scope of the invention be determined solely from the following claims.

What is claimed is:

1. A tunable laser including
   an active laser medium;
   means incluidng a pair of radially graded indexed optical segments aligned with and capable of focusing the laser to form an external resonant cavity with an optical axis, the respective optical segments being relatively movable along said optical axis to provide a variable etalon gap of dimensions sufficient to permit a variable tuning of the laser wavelength without altering the effective length of the resonant cavity.

2. The invention of claim 1 wherein the gap further includes a saturable absorbing material for providing a passive modelocking of the laser.

3. The invention of claim 1 further including a third radially graded indexed optical segment spaced from one of the other segments to provide a second gap, the second gap filled with a saturable absorbing material for providing a passive modelocking of the laser.

4. The invention of claim 1 wherein the laser medium and the pair of optical segments are aligned on a longitudinal optical axis and the gap is slanted at a small angle to a plane normal to the optical axis.

5. The invention of claim 1 wherein the respective internal surfaces of the gap are coated with partial reflective coatings.

6. The invention of claim 1 further including means for providing an active modelocking of the laser medium with an RF frequency.

7. The invention of claim 5 wherein the end surface of the optical segment adjacent the laser medium is coated with an anti-reflective coating while the end surface furthest from the laser medium is coated with a highly reflective coating.

8. The invention of claim 7 wherein the active laser medium is a semiconductor laser diode having an anti-reflective coating on its end surface adjacent the optical segment.

9. The invention of claim 8 wherein a saturable absorbing dye is provided in the gap to provide a passive modelocking of the laser.

10. An improved passive modelocking laser including:
    an active laser medium;
    means including a pair of radially graded indexed optical rods aligned with and focusing the laser to form an external resonant cavity complimentary to the laser medium, the respective optical rods being positioned relative to the laser medium and to each other to provide a gap along the optical axis of a dimension which does not alter the effective length of the resonant cavity, and
    a saturable absorbing material provided in the gap to permit a passive modelocking of the laser.

11. The invention of claim 10 further including means to vary the width of the gap to provide a tunable etalon with a high Q for certain wavelengths.

12. The invention of claim 11 wherein the saturable absorbing material is a dye.

13. The invention of claim 12 further including resilient sealing means to maintain sufficient dye material within the gap during the variation of the gap to prevent any change in the index of refraction of the medium between the optical rods.

14. An improved tunable passive modelocking laser including:
    a semiconductor laser diode;

means including a pair of radially graded indexed optical rods aligned with and focusing the laser to form an external resonant cavity having an optical axis, the respective optical rods being relatively movable along the optical axis to provide a variable etalon gap of dimensions sufficient to permit a variable tuning of the laser wavelength without altering the effective length of the resonant cavity, the respective internal surfaces of the etalon gap having a partially reflective coating to provide a high Q for wavelengths of integral submultiples of twice the gap width while limiting noise;

means for moving the respective rods to vary the gap, and a saturable absorbing dye positioned within the gap to provide a passive modelocking of the laser.

* * * * *